United States Patent
Charrat

(10) Patent No.: US 7,113,139 B2
(45) Date of Patent: Sep. 26, 2006

(54) TUNABLE ANTENNA CIRCUIT, PARTICULARLY FOR CONTACTLESS INTEGRATED CIRCUIT READER

(75) Inventor: Bruno Charrat, Aix en Provence (FR)

(73) Assignee: Inside Contactless, Aix-en-Provence Cedex ( * ) Notice: Subject to any disclaimer, the term of this patent is extended or adjusted under 35 U.S.C. 154(b) by 0 days.

(21) Appl. No.: 11/123,534

(22) Filed: May 6, 2005

(65) Prior Publication Data

US 2005/0219132 A1   Oct. 6, 2005

Related U.S. Application Data

(63) Continuation of application No. PCT/FR03/03295, filed on Nov. 5, 2003.

(30) Foreign Application Priority Data

Nov. 12, 2002   (FR) .................................. 02 14127

(51) Int. Cl.
*H01Q 9/00* (2006.01)
(52) U.S. Cl. ........................................ 343/745; 343/750
(58) Field of Classification Search ................ 343/745, 343/750, 860, 741, 866, 895
See application file for complete search history.

(56) References Cited

U.S. PATENT DOCUMENTS

| | | | | |
|---|---|---|---|---|
| 1,742,602 A | * | 1/1930 | Kolster | ........................ 455/290 |
| 2,408,826 A | * | 10/1946 | Vogel | ........................... 455/87 |
| 3,010,098 A | * | 11/1961 | Pomeroy | .................... 340/514 |
| 6,028,503 A | | 2/2000 | Preishuberpflügl et al. | |
| 6,070,803 A | | 6/2000 | Stobbe | |

FOREIGN PATENT DOCUMENTS

| | | |
|---|---|---|
| DE | 195 46 928 A1 | 6/1997 |
| DE | 197 55 250 A1 | 7/1999 |
| EP | 0 663 724 A2 | 7/1995 |

* cited by examiner

*Primary Examiner*—Tan Ho
(74) *Attorney, Agent, or Firm*—Akin Gump Strauss Hauer & Feld, LLP

(57) ABSTRACT

An antenna circuit tunable to a determined resonance frequency, includes an antenna coil and adjustable components. The antenna circuit includes a filter having at least one point to tap an electric voltage the amplitude of which forms a pertinent indication for the tuning of the antenna circuit. To tune the antenna circuit, the adjustable components of the antenna circuit are adjusted so that the electric voltage has a determined amplitude.

36 Claims, 3 Drawing Sheets

TUNABLE ANTENNA CIRCUIT, PARTICULARLY FOR CONTACTLESS INTEGRATED CIRCUIT READER

CROSS-REFERENCE TO RELATED APPLICATIONS

This application is a continuation of International Application No. PCT/FR2003/003295, filed Nov. 5, 2003, which was published in the English language on May 7, 2004, under International Publication No. WO2004/045074 A1, and the disclosure of which is incorporated herein by reference.

BACKGROUND OF THE INVENTION

The present invention relates to inductive antenna circuits, particularly for contactless integrated circuit readers, and more particularly, to an antenna circuit tunable to a determined resonance frequency, comprising an antenna coil and adjustable components. The present invention further relates to a method for tuning such an antenna circuit.

FIG. 1 schematically represents a contactless integrated circuit reader RD equipped with an antenna circuit 10 of the aforementioned type. The antenna circuit 10 comprises a coil L and adjustable components, such as two adjustable capacitors C1, C2. The antenna circuit receives an alternating current (AC) excitation signal $S_e$ of frequency $F_0$ supplied by the reader RD, and sends an AC magnetic field FLD. This magnetic field enables the reader RD to communicate by inductive coupling with contactless integrated circuits CIC1, CIC2 ... CICn which are each equipped with a respective antenna coil L1, L2, ... Ln. The integrated circuits CIC1–CICn are, for example, contactless smart card integrated circuits, contactless electronic tag integrated circuits, contactless badge integrated circuits, and the like.

The adjustable capacitors C1, C2 enable the resonance frequency of the antenna circuit to be tuned to the frequency $F_0$ of the excitation signal, which is for example 13.56 Mega Hertz (MHz) according to the International Standards Organization (ISO) standards ISO 15693 and ISO 14443. The tuning of the antenna circuit to the frequency $F_0$ enables an optimal communication distance to be obtained between the reader and the contactless integrated circuits.

Although this tuning is generally performed at the time of commissioning the antenna circuit, the latter is then subjected to variations in humidity and temperature that can substantially affect its resonance frequency. The presence of metal objects in the proximity of the antenna circuit further influences the resonance frequency. The antenna circuit must therefore be tuned again on site to take its conditions of use into account. It must then be tuned at regular intervals if the reader RD is to have an optimal communication distance.

The tuning of the antenna circuit can be performed manually but this solution requires the intervention of qualified staff. Furthermore, a manual tuning can prove difficult in certain conditions of use. As an example, a contactless badge reader dedicated to controlling access in high altitude transport facilities (e.g., chair lifts, cable cars, etc.) will be considered. Due to the poor weather conditions and the very low temperatures, it is difficult to adjust the components of the antenna circuit bare-handed, using a screwdriver.

In this case, an electrically tunable antenna circuit is provided comprising embedded equipment that automatically tunes the antenna circuit ("autotuning"), once a day for example.

FIG. 2 represents an electrically tunable antenna circuit 20, comprising electrically adjustable capacitors C1, C2 for that purpose. The capacitor C1 comprises a capacitor $C1_0$ in parallel with a plurality of switchable capacitors $C1_i$. The capacitor C2 comprises a capacitor $C2_0$ in parallel with a plurality of switchable capacitors $C2_j$. Each capacitor $C1_i$, $C2_j$, respectively, is switchable by an electric relay $RL_i$, $RL_j$, respectively, arranged in series with the capacitor. The relays $RL_i$ are driven by signals $S_i$ and the relays $RL_j$ are driven by signals $S_j$. Thus, the combination of signals $S_i$ determines the value of the capacitor C1 and the combination of signals $S_j$ determines the value of the capacitor C2.

FIG. 3 represents curves of phase $\phi$ and of impedance Z of the antenna circuit 20 when it receives an excitation signal Se oscillating at the frequency $F_0$, such as 13.56 MHz for example.

The tuning of the antenna circuit 20 to the frequency $F_0$ theoretically involves finding a pair of determined values of the impedance Z and of the phase $\phi$, generally Z=50Ω and $\phi=0°$.

However, a piece of equipment for measuring the phase $\Phi$ and the impedance Z is generally too costly and cumbersome to form an embedded piece of equipment.

Thus, as shown in FIG. 4, the embedded equipment performing the automatic tuning of the antenna circuit generally includes a simple voltage standing wave ratio (VSWR) meter TMR arranged between the antenna circuit 20 and the reader RD, and a tuning device TC1 supplying the signals $S_i$, $S_j$ for controlling the relays of the antenna circuit. The VSWR meter TMR measures the voltage standing wave ratio and the device TC1 tunes the antenna circuit so that the voltage standing wave ratio is minimal at the frequency $F_0$.

This tuning method is simple and inexpensive, but the precision of it is mediocre. Indeed, the voltage standing wave ratio provides an indication which, although it is pertinent, can be considered in the light of experience acquired, to be insufficient in itself to achieve reliable and precise tuning. Furthermore, an adjustment of the antenna circuit based on the voltage standing wave ratio is long and difficult to find. Many combinations of the signals Si, Sj must be tested before finding the combination taken to be optimal.

Thus, it is desirable to provide a method for tuning an antenna circuit that is more precise than the classical method described above. It is also desirable to provide a tuning method that is precise and that can be implemented by embedded equipment that is simple and affordable to produce. It is also desirable to provide an antenna circuit that is simple to tune.

BRIEF SUMMARY OF THE INVENTION

Briefly stated, the present invention comprises an antenna circuit including an integral filter or a phase shifter at the terminals of which a voltage appears the amplitude of which provides a pertinent indication capable of being used to tune the antenna circuit with precision, when the amplitude of the excitation signal is known. If the amplitude of the excitation signal is not known, the present invention provides for measuring two voltages at the terminals of the filter and for tuning the antenna circuit so that these two voltages have a determined amplitude ratio and a determined phase difference.

The present invention also comprises an antenna circuit tunable to a determined resonance frequency. The antenna circuit includes an antenna coil and adjustable components, as well as a filter that is an integral part of the antenna circuit.

The filter has at least one electric voltage tap point to tap an electric voltage the amplitude of which forms a pertinent indication for tuning the antenna circuit.

According to one embodiment, the filter is arranged at the input of the antenna circuit.

According to one embodiment, the filter has a structure in Π.

According to one embodiment, the filter is an inductor-capacitor (LC) element.

According to one embodiment, the filter includes a series inductor and two capacitors in parallel.

According to one embodiment, the antenna circuit includes an embedded measuring circuit connected to the filter at least at the at least one electric voltage tap point.

According to one embodiment, the filter has two electric voltage tap points to two electric voltages the amplitude ratio of which forms a pertinent indication for tuning the antenna circuit.

According to one embodiment, the antenna circuit includes an embedded measuring circuit connected to the two points for tapping the two electric voltages.

According to one embodiment, the measuring circuit includes amplitude measuring circuitry that supplies two signals proportional to the amplitude of the electric voltages.

According to one embodiment, the measuring circuit includes phase difference measuring circuitry that measures the phase difference between the two electric voltages.

According to one embodiment, the phase difference measuring circuitry supplies a signal that is proportional to the phase difference between the two electric voltages.

According to one embodiment, the phase difference measuring circuitry includes a logic gate receiving input signals resulting from the two electric voltages and an output that supplies a signal proportional to the duty cycle ratio of a signal supplied by the logic gate.

According to one embodiment, the antenna circuit includes an embedded tuning device configured to adjust the adjustable components of the antenna circuit so that the two electric voltages have a determined amplitude ratio.

According to one embodiment, the tuning device is configured to adjust the adjustable components of the antenna circuit so that the two electric voltages have the same amplitude.

According to one embodiment, the embedded tuning device is configured to adjust the adjustable components of the antenna circuit so that the two electric voltages also have a determined phase difference.

According to one embodiment, the tuning device is configured adjust the adjustable components of the antenna circuit so that the two electric voltages have a phase difference of about 90°.

According to one embodiment, the tuning device includes a microprocessor receiving a first signal representative of the amplitude of one of the two electric voltages, a second signal representative of the amplitude of the other electric voltage, and a third signal representative of the phase difference between the two electric voltages. The microprocessor supplies to the antenna circuit signals for controlling the adjustable components.

According to one embodiment, during the tuning of the antenna circuit by the tuning device, the antenna circuit receives an excitation signal supplied by a contactless integrated circuit reader.

According to one embodiment, the adjustable components include electrically switchable capacitors.

According to one embodiment, the antenna circuit comprises adjustable components each comprising a capacitor, a diode connected to the cathode of the capacitor, and a switch transistor for applying or not applying a bias voltage to the anode of the diode, so that the capacitor is active or inactive in the antenna circuit.

The present invention also comprises a contactless integrated circuit reader, comprising an antenna circuit according to the present invention.

The present invention also comprises a method for tuning to a determined resonance frequency an antenna circuit comprising an antenna coil and adjustable components. The method includes incorporating a filter into the antenna circuit so that the filter is an integral part of the antenna circuit; applying an excitation signal to the antenna circuit; tapping at least a first electric voltage at a terminal of the filter; and adjusting the adjustable components of the antenna circuit so that the first electric voltage has a determined amplitude.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 5:
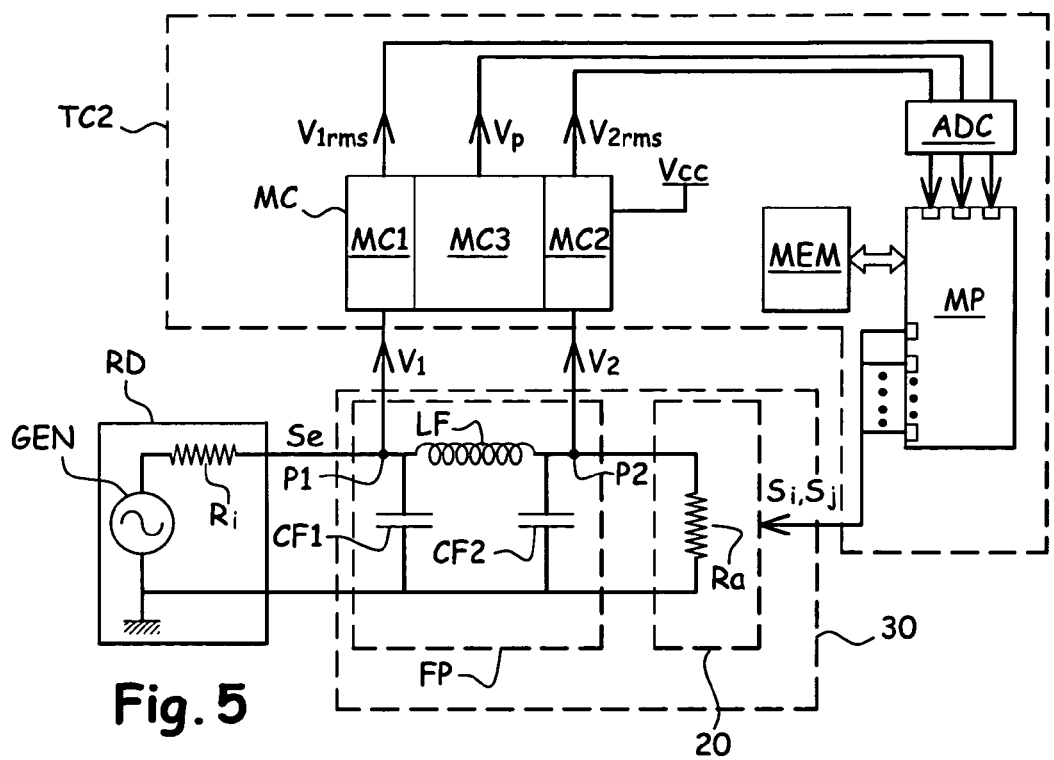
FIG. 5 is a schematic diagram of a contactless reader comprising an antenna circuit according to the present invention and an automatic tuning device according to the present invention.

FIG. 5 represents a contactless integrated circuit reader RD comprising an antenna circuit 30 according to the present invention and an embedded tuning device TC2. The antenna circuit 30 and the tuning device TC2 can be produced on the same medium, such as on a same printed circuit board for example. They thus form a global antenna circuit integrating means for automatically tuning the actual antenna circuit.

The antenna circuit 30 according to the present invention comprises an antenna circuit 20 and a filter FP. The antenna circuit 20 is an electrically tunable antenna circuit comprising electrically adjustable components. Its structure is for example that of the antenna circuit described above in relation with FIG. 2. The antenna circuit 20 is here represented tuned, in the form of a non-reactive resistor Ra of 50Ω.

The filter FP is connected to the input of the antenna circuit 20 and is an integral part of the antenna circuit 30. The input of the filter FP forms the input of the antenna circuit 30. An excitation signal Se is applied to the antenna circuit 30, i.e., to the input of the filter FP, and is transmitted to the antenna circuit 20 via the filter FP.

For more clarity, the antenna circuit 20 will hereinafter be called "sub-antenna circuit", so as to distinguish it from the antenna circuit 30.

The filter FP is here a filter in Π comprising a series inductor LF and two capacitors CF1, CF2. Generally speaking, "capacitor X" (X being CF1 or CF2 for example) designates a capacitor having a capacitance which is equal to X or a group of capacitors in series and/or in parallel forming a resulting capacitance of value X.

The excitation signal Se is here supplied by a contactless integrated circuit reader RD, comprising an alternating current (AC) signal generator GEN having an internal series resistor Ri of about 50Ω.

It is assumed here that the antenna circuit according to the present invention is intended for readers of various origins the electrical characteristics of which are not constant, and it is therefore considered here that the nominal amplitude of the excitation signal Se is not known. The nominal amplitude is the amplitude of the signal Se when the generator GEN is linked to a standard load, generally about 50Ω.

In these conditions, the tuning device TC2 is linked to the filter FP at two points P1, P2 for tapping two voltages V1, V2, located at the input of the filter FP (i.e., the input of the antenna circuit 30) and at the output of the filter FP (i.e., the input of the sub-antenna circuit 20). The point P1 is therefore located here on a terminal of the inductor LF and on the anode of the capacitor CF1 and the point P2 is located on the other terminal of the inductor LF and on the anode of the capacitor CF2.

According to the present invention, the capacitors CF1, CF2 and the inductor LF are determined when the antenna circuit 30 is designed, in the following manner:

1) the sub-antenna circuit 20 is tuned to the desired resonance frequency, such as 13.56 MHz for example, and thus has a determined input impedance Z and a determined phase φ, generally 50Ω and 0°, 2) the filter FP is combined with the sub-antenna circuit 20 to form the antenna circuit 30 according to the present invention, and the values of CF1, CF2, LF are then determined by theoretical calculation and/or by experiments. The values of CF1, CF2, LF are such that the antenna circuit 30 always has, seen from its input, an impedance Z of 50Ω and a phase φ of 0° despite the presence of the filter.

According to the studies carried out by the applicant, the values of CF1, CF2, LF for a frequency of F0 of 13.56 MHz are for example:

CF1=CF2=220 pF

LF=560 nH

The filter FP is thus a low-pass filter having a cut-off frequency greater than the targeted tuning frequency F0, here 13.56 MHz.

After determining CF1, CF2, LF, the amplitude ratio and the phase difference between the voltages V1 and V2 are measured at the input and at the output of the filter FP, again at the targeted frequency F0. With a filter in Π, it can be seen that the amplitude of V1 is equal to the amplitude of V2 and that the phase difference between these two voltages is about 90°.

Once the values CF1, CF2, LF have been found, as well as the amplitude ratios and the phase difference between V1 and V2, the filter FP can be industrially manufactured, preferably with quality components, and can be integrated into all of the antenna circuits 30 according to the present invention that are marketed and which comprise sub-antenna circuits 20 of same structure.

When the antenna circuit 30 is not tuned to the targeted frequency, here 13.56 MHz, at the terminals of the filter FP, voltages V1 and V2 are found which have different amplitudes and a phase difference that is not equal to 90°. In this case, the tuning of the antenna circuit 30 can be obtained simply, by adjusting the components of the sub-antenna circuit 20 so that the amplitude of V1 becomes equal to the amplitude of V2 and so that the phase difference between these two voltages becomes equal to 90°. Once the tuning to the frequency F0 obtained, the filter FP behaves like a wire having an output voltage V2 equal to the input voltage V1 and an output phase in quadrature with the input phase (±90°).

The precision of the tuning that can be obtained is greater than the precision that can be obtained with a simple voltage standing wave ratio (VSWR) meter.

The tuning of the antenna circuit 30 is here performed at regular intervals by the embedded device TC2. This device mainly comprises a measuring circuit MC and a microprocessor MP equipped with a program memory MEM.

The circuit MC comprises two rectifier circuits MC1, MC2 and a phase difference measuring circuit MC3. The circuit MC1 receives the voltage V1 at input and supplies a direct current (DC) signal V1rms representative of the amplitude of the voltage V1. The circuit MC2 receives the voltage V2 at input and supplies a dc signal V2rms representative of the amplitude of the voltage V2. The circuit MC3 receives the voltages V1 and V2 at input and a DC signal Vp representative of the phase difference between the voltages V1 and V2. The signals V1rms, V2rms and Vp are applied to the microprocessor MP through an analog-digital converter ADC, which supplies the signals $S_i$, $S_j$ described above, performing the control of the adjustable components of the sub-antenna circuit 20.

Figure 6:
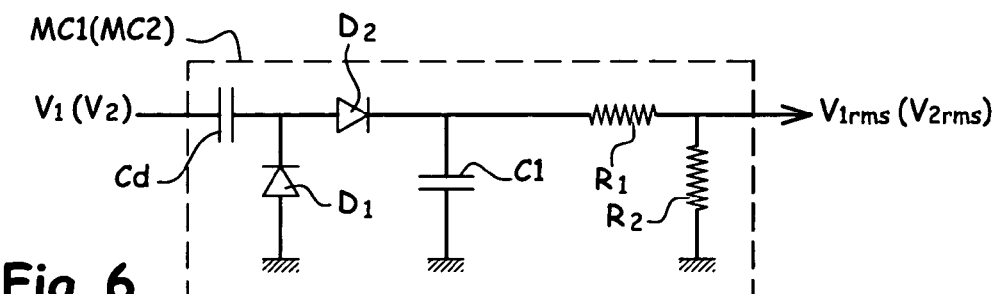
FIG. 6 is a detailed electrical schematic diagram of the measuring circuit represented in block form in FIG. 5.

FIG. 6 represents an example of an embodiment of the circuit MC1 or MC2. The voltage V1 or V2 is applied, through a decoupling capacitor Cd, to the cathode of a reverse biased diode D1 having its anode connected to the ground, as well as to the anode of a forward biased diode D2. The cathode of the diode D2 is linked to the anode of a capacitor C1 the cathode of which is connected to the ground, and to a voltage-divider bridge here comprising two resistors R1, R2. The output of the divider bridge R1, R2 forms the output of the circuit MC1 or MC2 and supplies the voltage V1rms or V2rms.

Figure 7:
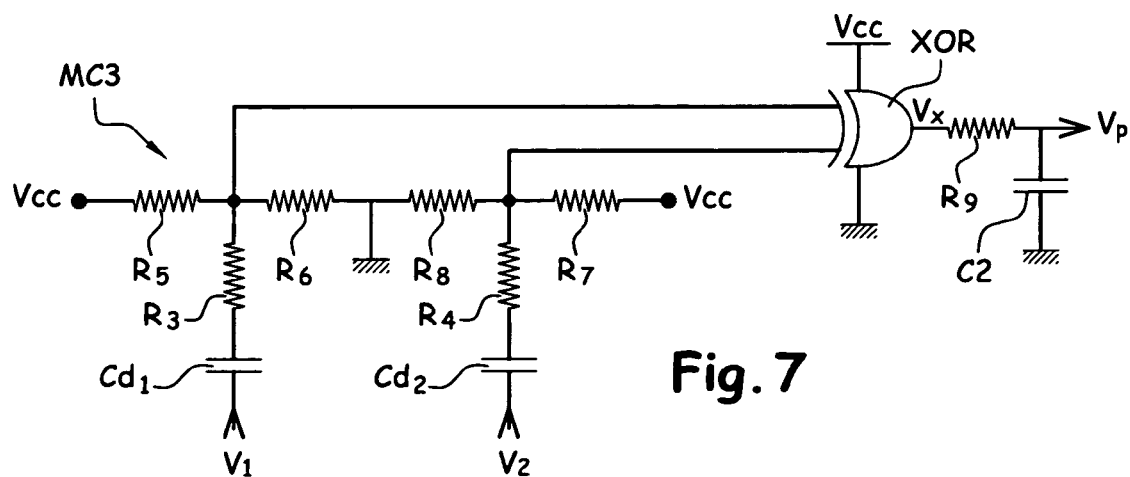
FIG. 7 is a detailed electrical schematic diagram of another measuring circuit represented in block form in FIG. 5.
Figure 8A:
FIGS. 8A to 8D are timing diagrams of electric signals showing the operation of the measuring circuit in FIG. 7.
Figure 8B:
Figure 8C:
Figure 8D:
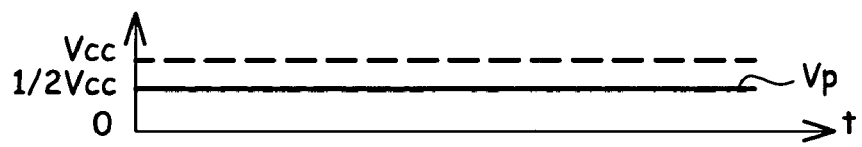

FIG. 7 shows an example of an embodiment of the circuit MC3. The voltage V1 is applied to a first input of an "exclusive or" (XOR) logic gate through a decoupling capacitor Cd1 and a series resistor R3. The voltage V2 is applied to a second input of the gate XOR through a decoupling capacitor Cd2 and a series resistor R4. Furthermore, the first input of the XOR gate is DC voltage biased by being connected to the middle point of a voltage divider bridge comprising two resistors R5, R6 in series, the resistor R5 receiving a voltage Vcc and the resistor R6 being connected to the ground. Similarly, the second input of the XOR gate is DC voltage biased by being connected to the middle point of a voltage-divider bridge comprising two resistors R7, R8 in series, the resistor R7 receiving the voltage Vcc and the resistor R8 being connected to the ground. The XOR gate is powered by the voltage Vcc and its output supplies a signal Vx. The signal Vx is applied to a low-pass filter comprising for example a series resistor R9 and a capacitor C2 the cathode of which is connected to the ground. The output of the low-pass filter supplies the signal Vp.

FIGS. 8A to 8D, respectively, represent the shape of the signals V1, V2, Vx and Vp when the voltages V1 and V2 are phase-shifted by 90°. The voltages V1, V2 as applied to the DC voltage biased inputs of the XOR gate form logic signals. Thus, the low value of the voltages V1, V2 (negative half-wave) represents the logic "0" and the high value (positive half-wave) represents the logic "1" (Vcc). As the signals V1, V2 are in quadrature, the output signal Vx is a logic signal of frequency double that of V1, V2 having a duty cycle of 0.5. In these conditions, the signal Vp is equal to 0.5 Vcc. The signal Vp is equal to 0 when the signals V1, V2 are in opposite phase and is equal to Vcc when these signals are in phase.

Thus, the search by the microprocessor MP for a phase difference of 90° between V1 and V2 here corresponds to the search for a value of Vp equal to 0.5 Vcc, i.e. half of the full-scale digital value Vpmax that can be supplied by the converter ADC.

In summary, the tuning of the antenna circuit by the microprocessor MP here involves searching for the right combination of signals Si, Sj such that V1rms=V2rms Vp=0,5 Vpmax To simplify the work of the microprocessor MP and to reduce the time required to search for the right combination of signals Si, Sj, it is advantageous to load a correlation map into the memory MEM enabling the microprocessor to rapidly find the combination searched for using the values V1rms, V2rms, Vp supplied by the measuring circuit MC.

The time interval between two sequences of tuning the resonance frequency of the antenna circuit 30 can be predetermined and under the control of the microprocessor MP. The tuning sequences can also be under the control of the reader RD which sends the microprocessor MP a retiming signal when a tuning sequence must be performed. This retiming signal can be implicit and consist, for example, in a temporary interruption of the excitation signal Se. In this case, the microprocessor MP is programmed to start a new tuning sequence when the excitation signal reappears.

Figure 1:
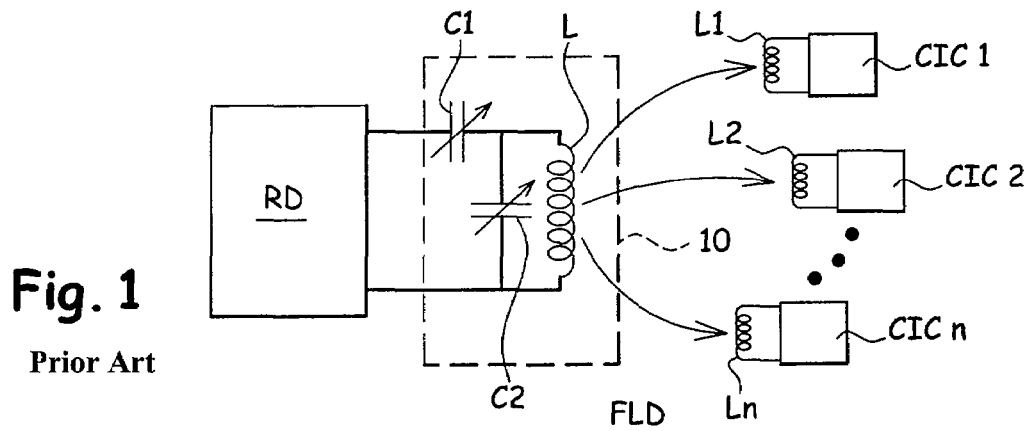
FIG. 1 is a schematic diagram of a conventional contactless reader equipped with a tunable antenna circuit.
Figure 2:
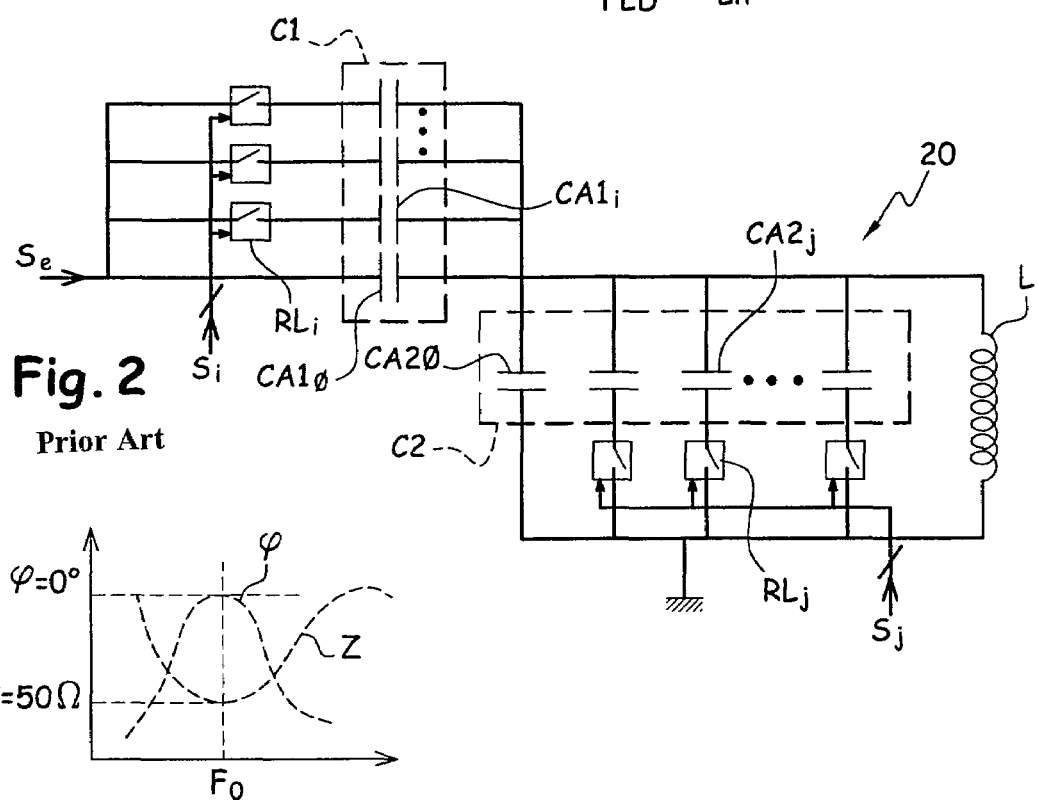
FIG. 2 is a schematic diagram of a conventional tunable antenna circuit comprising electrically adjustable components.
Figure 3:
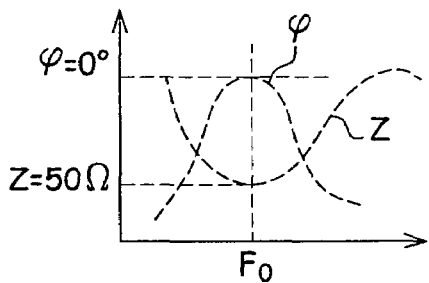
FIG. 3 is a graph showing phase and impedance curves of the antenna circuit of FIG. 2.
Figure 4:
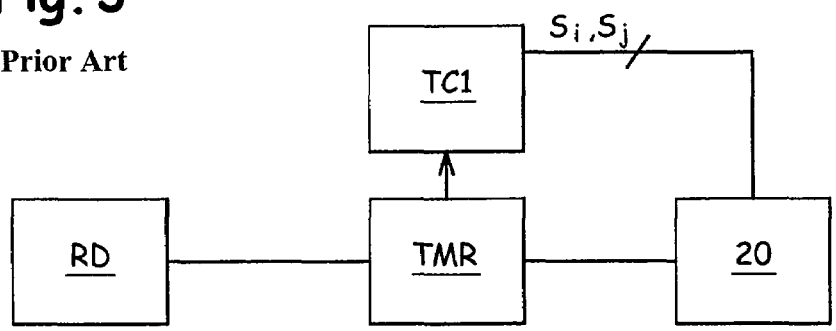
FIG. 4 is a schematic block diagram of a conventional antenna circuit having an automatic tuning device.

As indicated above, the sub-antenna circuit 20 can be produced in accordance with FIG. 2, i.e., by using relays $RL_i$, $RL_j$ to produce the electrically switchable components, generally switchable capacitors C1$i$, C2$j$.

However, relays are costly and cumbersome devices which can generate spurious switching activity and spurious resistance in the antenna circuit, capable of causing an attenuation of the antenna signal and/or a shift of the resonance frequency in time.

According to one optional but advantageous aspect of the present invention, the switchable capacitors CA1$i$, CA2$j$ of the antenna circuit 30 are produced by means of static switches such as bipolar transistors or metal oxide semiconductor (MOS) transistors, and a blocking diode.

Figure 9:
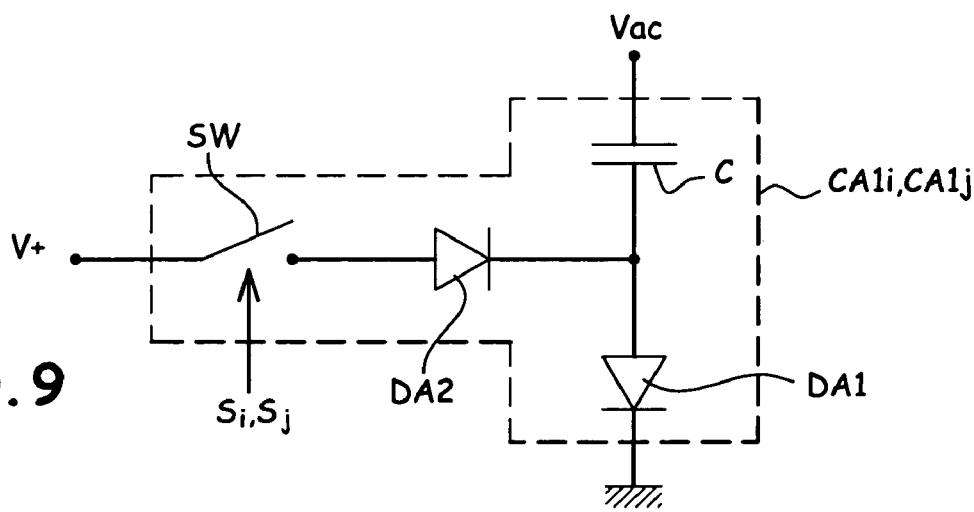
FIG. 9 is a detailed electrical schematic diagram of an adjustable component according to the present invention.

FIG. 9 represents a switchable component C1$i$, C2$j$ produced according to this principle. The component comprises a capacitor C the cathode of which is linked to the ground through a diode DA1 instead of being linked to the ground through an electric relay. When the antenna circuit 30 receives the excitation signal Se, the anode of the capacitor C receives an AC voltage Vac.

The anode voltage of the diode DA1 is controlled by a static switch SW, such as a MOS or bipolar transistor, driven by one of the signals Si or Sj supplied by the microprocessor MP. At one terminal, the switch SW receives a DC voltage V+ and its other terminal is linked to the anode of the diode DA1, through a diode DA2. The voltage V+ is thus supplied by the switch SW when the latter is in the "ON" state, and is applied to the anode of the diode DA1 via the diode DA2. This second diode DA2 is arranged in the forward direction relative to the voltage V+ and in the reverse direction relative to the voltage Vac, which prevents the latter from reaching the switch SW.

It should be noted that any other low-pass component can be provided in place of the diode DA2. Thus, for example, the use of an inductor to bias and turn on the diode DA1 may be preferred to using the diode DA2.

Figure 10A:
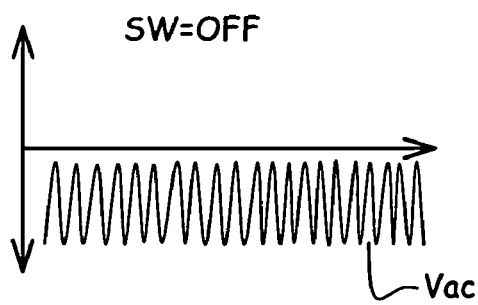
FIGS. 10A and 10B are graphs showing the operation of the adjustable component in FIG. 9.

When the switch transistor SW is in the OFF state, the capacitor C charges and its cathode has a negative voltage. The diode DA1 turns off since the half-waves of the voltage Vac copied on its anode are below the conduction threshold of the diode DA1, as shown in FIG. 10A.

Figure 10B:
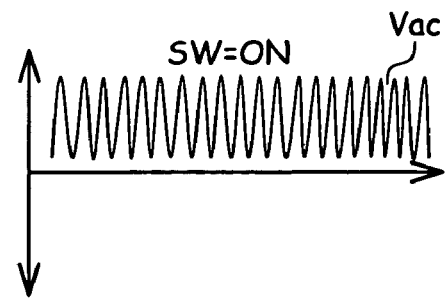

When the switch SW is in the ON state, the bias voltage V+ causes the voltage of the anode of the diode DA1 to rise again. The diode DA1 turns on since the half-waves of the voltage Vac copied at its anode via the capacitor C are above the conduction threshold of the diode DA1, as shown in FIG. 10B.

Thus, the switchable capacitor C1$i$, C2$j$ according to the present invention is active in the antenna circuit when the switch SW is in the ON state, and is inactive in the antenna circuit when the switch SW is in the OFF state. As the switch SW is controlled by one of the signals Si or Sj, the switchable capacitor CA1$i$, CA2$j$ is equivalent to a capacitor switched by means of a relay, but without the disadvantages of a relay.

It will be understood by those skilled in the art that various alternative embodiments and applications of the present invention are possible.

Thus, the method according to the present invention may comprise only a measurement of one of the voltages V1, V2 without a phase measurement if the nominal amplitude Vnom of the excitation signal Se is known. It will be assumed here as an example that the excitation signal has a nominal amplitude Vnom of 30V with a load of 50Ω. While the antenna circuit is not tuned the voltage V1 at the input of the antenna circuit or the voltage V2 at the output of the filter is not equal to 30V (V1=8V and V2=40V for example). When the antenna circuit is tuned, V1=V2=30V since the filter behaves like a 50Ω wire.

Furthermore, the method according to the present invention can be implemented with other types of filter, low-pass, high-pass, band-pass, in Π, in T, etc. preferably having cut-off frequencies that are above or below the targeted tuning frequency $F_0$, which must therefore preferably be within the bandwidth of the filter.

Moreover, the term "filter" is in no way restrictive in the context of the present invention and can designate any type of element, such as a tuned phase-shifter for example, having a determined impedance and a determined phase at the targeted tuning frequency. This element integrated into an antenna circuit according to the present invention is preferably an LC element without any resistive element that might attenuate the antenna signal, although resistive elements of low value can however by provided for various other reasons.

Depending on the LC element used as a "filter" within the meaning of the present invention, voltages V1, V2 can be obtained that have different amplitudes and a phase difference that is different by 90° at the targeted tuning frequency. The amplitude ratio and the phase difference of the voltages V1, V2 are then used as reference values for the tuning of the filter according to the present invention. However, the advantage of a filter in Π of LC-type is that it provides a phase difference of 90° that can be detected by means of a simple XOR gate, as described above.

Furthermore, although providing an embedded device TC2 automatically performing the tuning of the antenna circuit 30 was proposed above, the method of the present invention can also be implemented manually on an antenna circuit comprising manually adjustable components. However it is implemented, the method of the present invention offers the advantage of enabling an antenna circuit to be tuned with precision without requiring complex measuring means like impedance and phase analysers.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. An antenna circuit tunable to a determined resonance frequency, comprising an antenna coil and adjustable components, the antenna circuit comprising a filter that is an integral part of the antenna circuit and that has at least one voltage tap point to tap an electric voltage the amplitude of which forms a pertinent indication for tuning the antenna circuit.

2. The antenna circuit according to claim 1, wherein the filter is arranged at the input of the antenna circuit.

3. The antenna circuit according to claim 1, wherein the filter has a structure in Π.

4. The antenna circuit according to claim 1, wherein the filter is an inductor-capacitor (LC) element.

5. The antenna circuit according to claim 1, wherein the filter comprises a series inductor and two capacitors in parallel.

6. The antenna circuit according to claim 1, comprising an embedded measuring circuit connected to the filter at least at the at least one voltage tap point.

7. The antenna circuit according to claim 1, wherein the filter has two voltage tap points to tap two electric voltages the amplitude ratio of which forms a pertinent indication for tuning the antenna circuit.

8. The antenna circuit according to claim 7, comprising an embedded measuring circuit connected to the two voltage tap points.

9. The antenna circuit according to claim 8, wherein the embedded measuring circuit comprises amplitude measuring circuitry that supplies two voltage or direct current signals proportional to the amplitude of the electric voltages.

10. The antenna circuit according to claim 8, wherein the measuring circuit comprises phase difference measuring circuitry that measures the phase difference between the two electric voltages.

11. The antenna circuit according to claim 10, wherein the phase measuring circuitry supplies a voltage or direct current signal that is proportional to the phase difference between the two electric voltages.

12. The antenna circuit according to claim 11, wherein the phase difference measuring circuitry comprises a logic gate receiving input signals resulting from the two electric voltages and an output that is proportional to the duty cycle ratio of a signal supplied by the logic gate.

13. The antenna circuit according to claim 7, comprising an embedded tuning device configured to adjust the adjustable components of the antenna circuit so that the two electric voltages have a determined amplitude ratio.

14. The antenna circuit according to claim 13, wherein the tuning device is configured to adjust the adjustable components of the antenna circuit so that the two electric voltages have about the same amplitude.

15. The antenna circuit according to claim 13, wherein the embedded tuning device is configured to adjust the adjustable components of the antenna circuit so that the two electric voltages also have a determined phase difference.

16. The antenna circuit according to claim 15, wherein the tuning device is configured to adjust the adjustable components of the antenna circuit so that the two electric voltages have a phase difference of about 90°.

17. The antenna circuit according to claim 13, wherein the tuning device comprises a microprocessor receiving a first signal representative of the amplitude of one of the two electric voltages, a second signal representative of the amplitude of the other electric voltage, and a third signal representative of the phase difference between the two electric voltages, the microprocessor supplying to the antenna circuit signals for controlling the adjustable components.

18. The antenna circuit according to claim 13, wherein, during the tuning of the antenna circuit by the tuning device, the antenna circuit receives an excitation signal supplied by a contactless integrated circuit reader.

19. The antenna circuit according to claim 1, wherein the adjustable components comprise electrically switchable capacitors.

20. The antenna circuit according to claim 1, comprising adjustable components that each include a capacitor, a diode connected to the cathode of the capacitor and a switch transistor for applying or not applying a bias voltage to the anode of the diode, so that the capacitor is active or inactive in the antenna circuit.

21. A contactless integrated circuit reader comprising an antenna circuit according to claim 1.

22. A method for tuning to a determined resonance frequency an antenna circuit having an antenna coil and adjustable components, the method comprising:

incorporating a filter into the antenna circuit so that the filter is an integral part of the antenna circuit;

applying an excitation signal to the antenna circuit;

tapping at least a first electric voltage at a terminal of the filter; and adjusting the adjustable components of the antenna circuit so that the first electric voltage has a determined amplitude.

23. The method according to claim 22, further comprising:

tapping a second electric voltage at another terminal of the filter; and adjusting the adjustable components of the antenna circuit so that the two electric voltages have a determined amplitude ratio.

24. The method according to claim 23, wherein the adjustable components of the antenna circuit are adjusted so that the two electric voltages have about the same amplitude.

25. The method according to claim 23, wherein the adjustable components of the antenna circuit are adjusted so that the two electric voltages also have a determined phase difference.

26. The method according to claim 25, wherein the adjustable components of the antenna circuit are adjusted so that the two electric voltages have a phase difference of about 90°.

27. The method according to claim 23, wherein the two electric voltages are measured by an embedded measuring circuit permanently linked to the filter.

28. The method according to claim 22, wherein the filter is arranged at the input of the antenna circuit.

29. The method according to claim 22, wherein the filter has a structure in Π.

30. The method according to claim 22, wherein the filter is an inductor-capacitor (LC) element.

31. The method according to claim 22, wherein the filter comprises a series inductor and two capacitors in parallel.

32. The method according to claim 22, wherein the tuning of the antenna circuit is performed by an embedded tuning device permanently linked to the filter.

33. The method according to claim 32, wherein the embedded tuning device comprises a microprocessor programmed to cyclically tune the antenna circuit.

34. The method according to claim 22, wherein, during tuning, the antenna circuit receives an excitation signal supplied by a contactless integrated circuit reader.

35. The method according to claim 22, wherein the adjustable components of the antenna circuit comprise electrically switchable capacitors.

36. The method according to claim 22, wherein the tuning of the antenna circuit is performed by adjustable components that each include a capacitor, a diode connected to the cathode of the capacitor and a switch transistor for applying or not applying a bias voltage to the anode of the diode, so that the capacitor is active or inactive in the antenna circuit.

* * * * *